(12) United States Patent
Ji et al.

(10) Patent No.: US 8,691,701 B2
(45) Date of Patent: Apr. 8, 2014

(54) STRIP WITH REDUCED LOW-K DIELECTRIC DAMAGE

(75) Inventors: Bing Ji, Pleasanton, CA (US); Andrew D. Bailey, III, Pleasanton, CA (US); Maryam Moravej, Mountain View, CA (US); Stephen M. Sirard, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 538 days.

(21) Appl. No.: 12/463,155

(22) Filed: May 8, 2009

(65) Prior Publication Data

US 2010/0285671 A1    Nov. 11, 2010

(51) Int. Cl.
*H01L 21/302* (2006.01)

(52) U.S. Cl.
USPC ........... 438/725; 438/694; 438/696; 438/700; 438/706; 438/710; 438/734; 216/58; 216/67

(58) Field of Classification Search
None
See application file for complete search history.

(56) References Cited

U.S. PATENT DOCUMENTS

| | | | |
|---|---|---|---|
| 6,207,583 B1 * | 3/2001 | Dunne et al. | 438/725 |
| 7,235,479 B2 * | 6/2007 | Verhaverbeke | 438/637 |
| 7,294,580 B2 | 11/2007 | Yun et al. | |
| 2004/0224520 A1 * | 11/2004 | Yun et al. | 438/691 |
| 2006/0096952 A1 * | 5/2006 | Honda | 216/67 |
| 2008/0076259 A1 * | 3/2008 | Oota et al. | 438/706 |

OTHER PUBLICATIONS

H. Xiao, Introduction to Semiconductor Manufacturing Technology, published by Prentice Hall, 2001, ISBN 0-13-022404-9, pp. 335-337.*
S. Wolf, Silicon Processing for VLSI Era, vol. 4, Lattice Press, 2002, ISBN0-9616721-7-X, p. 659.*

* cited by examiner

*Primary Examiner* — Lan Vinh
*Assistant Examiner* — Jiong-Ping Lu
(74) *Attorney, Agent, or Firm* — Beyer Law Group LLP (57) ABSTRACT

A method for forming etched features in a low-k dielectric layer disposed below the photoresist mask in a plasma processing chamber is provided. Features are etched into the low-k dielectric layer through the photoresist mask. The photoresist mask is stripped, wherein the stripping comprising at least one cycle, wherein each cycle comprises a fluorocarbon stripping phase, comprising flowing a fluorocarbon stripping gas into the plasma processing chamber, forming a plasma from the fluorocarbon stripping gas, and stopping the flow of the fluorocarbon stripping gas into the plasma processing chamber and a reduced fluorocarbon stripping phase, comprising flowing a reduced fluorocarbon stripping gas that has a lower fluorocarbon flow rate than the fluorocarbon stripping gas into the plasma processing chamber, forming the plasma from the reduced fluorocarbon stripping gas, and stopping the flow of the reduced fluorocarbon stripping gas.

16 Claims, 6 Drawing Sheets

STRIP WITH REDUCED LOW-K DIELECTRIC DAMAGE

BACKGROUND OF THE INVENTION

1. Field of the Invention

The invention relates to a method of obtaining a structure on a semiconductor wafer by etching through a dielectric layer defined by an organic mask using a plasma and the subsequent stripping of the mask.

2. Description of the Related Art

In semiconductor plasma etching applications, a plasma etcher is usually used to transfer an organic mask pattern, such as a photoresist mask pattern, into a circuit and line pattern of an ultra low-k dielectric layer on a Si wafer. This is achieved by etching away the ultra low-k dielectric layer underneath the photoresist materials in the opened areas of the mask pattern. This etching reaction is initiated by the chemically active species and electrically charged particles (ions) generated by exciting an electric discharge in a reactant mixture contained in a vacuum enclosure, also referred to as a reactor chamber. Additionally, the ions are also accelerated towards the wafer materials through an electric field created between the gas mixture and the wafer materials, generating a directional removal of the etching materials along the direction of the ion trajectory in a manner referred to as anisotropic etching. At the finish of the etching sequence, the masking materials are removed by stripping it away, leaving in its place replica of the lateral pattern of the original intended mask patterns.

SUMMARY OF THE INVENTION

To achieve the foregoing and in accordance with the purpose of the present invention, a method for forming etched features in a low-k dielectric layer disposed below a photoresist mask in a plasma processing chamber is provided. The features are etched into the low-k dielectric layer through the photoresist mask. The photoresist mask is stripped after the features are etched into the low-k dielectric layer, wherein the stripping comprising at least one cycle, wherein each cycle comprises a fluorocarbon stripping phase, comprising flowing a fluorocarbon stripping gas into the plasma processing chamber, forming a plasma from the fluorocarbon stripping gas, and stopping the flow of the fluorocarbon stripping gas into the plasma processing chamber and a reduced fluorocarbon stripping phase, comprising flowing a reduced fluorocarbon stripping gas that has a lower fluorocarbon flow rate than the fluorocarbon stripping gas into the plasma processing chamber, forming the plasma from the reduced fluorocarbon stripping gas, and stopping the flow of the reduced fluorocarbon stripping gas.

In another manifestation of the invention, a method for stripping an organic mask layer from over an etched low-k dielectric layer in a processing chamber is provided. The organic mask is stripped from the etched low-k dielectric layer comprising at least one cycle, wherein each cycle comprises a fluorocarbon stripping phase, comprising flowing a fluorocarbon stripping gas into the processing chamber, forming a plasma from the fluorocarbon stripping gas, and stopping the flow of the fluorocarbon stripping gas into the processing chamber, and a reduced fluorocarbon stripping phase, comprising flowing a reduced fluorocarbon stripping gas that has a lower fluorocarbon flow rate than the fluorocarbon stripping gas into the processing chamber, forming the plasma from the reduced fluorocarbon stripping gas, and stopping the flow of the reduced fluorocarbon stripping gas.

In another manifestation of the invention, an apparatus for forming features in a low-k dielectric layer disposed below a photoresist mask is provided. A plasma processing chamber, comprises a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure. A gas source is in fluid connection with the gas inlet, and comprises an etching gas source, a fluorocarbon stripping gas source, and a reduced fluorocarbon stripping gas source. A controller is controllably connected to the gas source and the at least one electrode and comprises at least one processor and computer readable media. The computer readable media comprises computer readable code for etching the features into the low-k dielectric layer through the photoresist mask and computer readable code for stripping the photoresist mask after the features are etched into the low-k dielectric layer. The computer readable code for stripping the photoresist mask comprises at least one cycle, wherein each cycle comprises a fluorocarbon stripping phase, comprising flowing a fluorocarbon stripping gas into the plasma processing chamber, forming a plasma from the fluorocarbon stripping gas, and stopping the flow of the fluorocarbon stripping gas into the plasma processing chamber and a reduced fluorocarbon stripping phase, comprising flowing a reduced fluorocarbon stripping gas that has a lower fluorocarbon flow rate than the fluorocarbon stripping gas into the plasma processing chamber, forming the plasma from the reduced fluorocarbon stripping gas, and stopping the flow of the reduced fluorocarbon stripping gas.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In semiconductor via first trench last (VFTL) dual damascene (DD) processing, silicon oxide based low dielectric constant (low-k) materials with added organic component to provide a lower dielectric constant are exposed to various reactants during etch and resist strip process. The exposed low-k dielectric materials are often damaged by etch/strip plasmas and chemicals. In general, low-k damage includes changes in material composition (e.g., carbon depletion), morphology (density or porosity), and/or surface property (e.g., hydrophobic to hydrophilic). The damaged layer no longer possesses the intended dielectric properties, and can lead to device yield loss and/or reliability failures. Therefore reducing damage during low-k dielectric etch/strip has become one of the most critical challenges in semiconductor processing. Unlike the pristine (undamaged) low-k materials, the damaged layer can be readily removed by dilute HF solution. It is a common practice to quantify low-k material damage after etch and strip by measuring the material loss after dipping the sample in dilute HF solution.

Efforts have been made to reduce damage during low-k dielectric etch and strip processes. The prior art methods are primarily in the optimization of etch and strip processes by optimizing process chemistry, hardware configuration, and/or plasma sources (e.g. RF vs. microwave) etc. These prior art efforts have resulted in only limited success. As the dielectric constant (k value) continues to reduce, and the material becomes more porous, and the critical dimension becomes smaller, damage becomes a more severe issue in the most advanced integrated circuit processing.

Another prior art method is to repair the damaged layer after etching and striping of the low-k dielectric materials. Although this approach can repair some of the damages in the low-k dielectric materials, it requires a separate and different tool set. Therefore it increases production cost and decreases throughput.

In addition, it is desirable that after the etching is completed that the photoresist mask be quickly stripped without damaging the low-k dielectric layer. Some strip processes are too slow. Other strip processes damage the low-k dielectric layer. Other strip processes cause necking or other distortions of the etched features.

An embodiment of the invention provides a way to strip a photoresist mask after the low-k dielectric layer is etched that is fast with reduced damage to the low-k dielectric and has reduced distortion.

Figure 1:
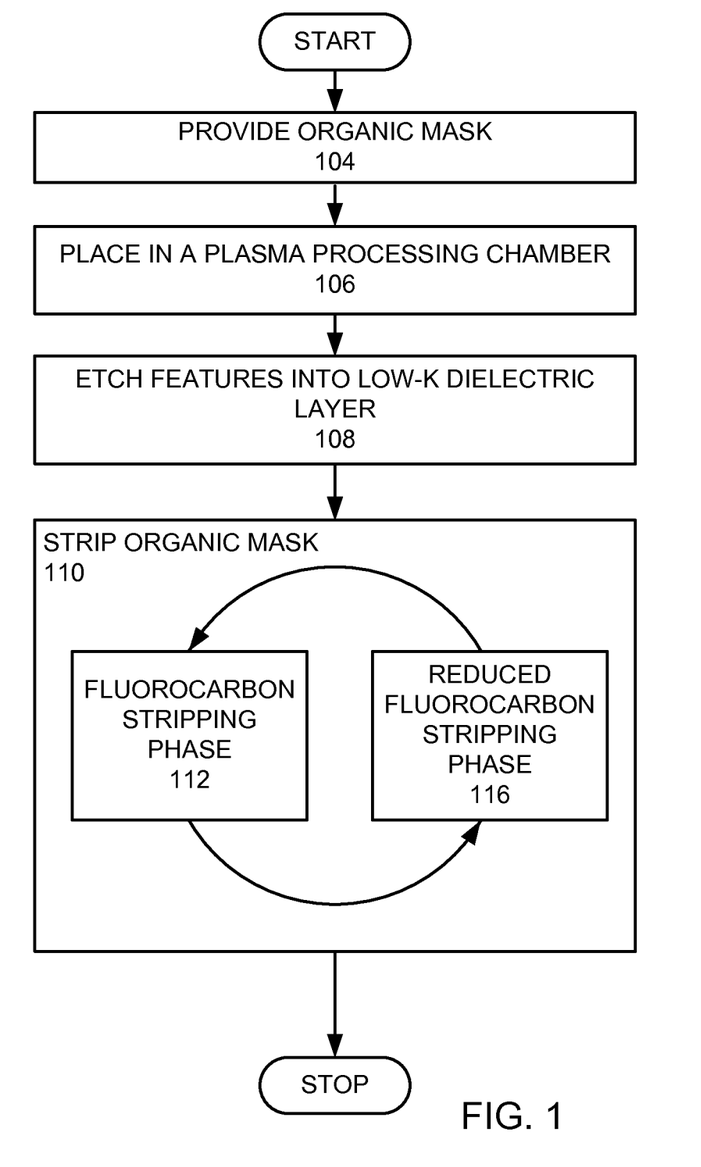
FIG. 1 is a flow chart of an inventive etch process.
Figure 2A:
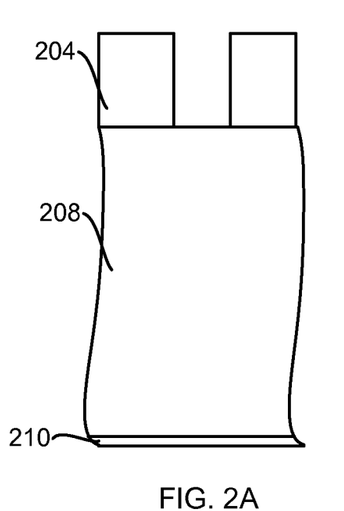
FIGS. 2A-D are schematic views of the formation of a feature using the inventive process.

FIG. 1 is a high level flow chart of an embodiment of the invention. In this embodiment, a patterned organic mask is formed over a low-k dielectric layer (step 104). FIG. 2A is a schematic cross-sectional view of a substrate 210, over which a low-k dielectric layer 208 is disposed, over which a patterned organic mask 204 has been formed. One or more intermediate layers may be disposed between the substrate (wafer) 210 and the low-k dielectric layer 208. One or more intermediate layers, such as an antireflective coating and/or a hard mask layer, may be disposed between the low-k dielectric layer 208 and the patterned organic mask 204.

Figure 3:
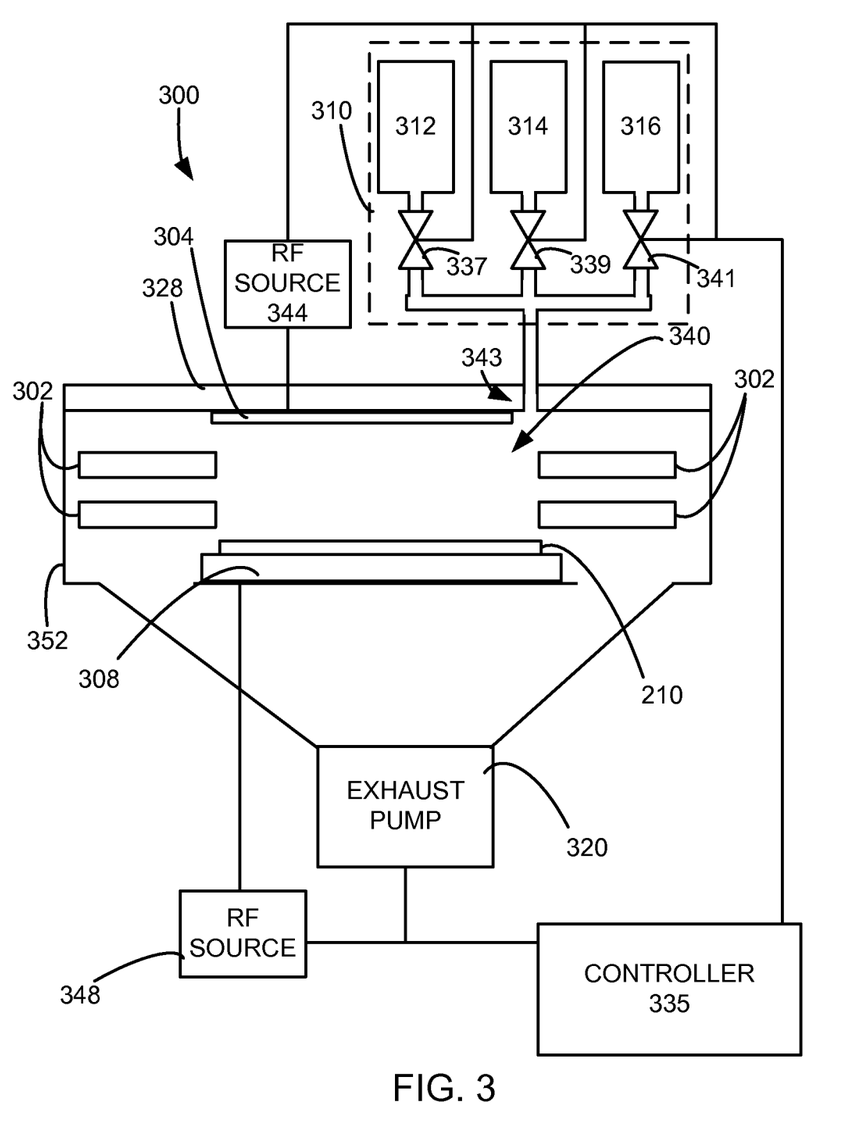
FIG. 3 is a schematic view of a system that may be used in practicing the invention.

The substrate 210 is placed in a plasma processing chamber (step 106). FIG. 3 is a schematic view of a plasma processing chamber 300 that may be used in the preferred embodiment of the invention. In this embodiment, the plasma processing chamber 300 comprises confinement rings 302, an upper electrode 304, a lower electrode 308, a gas source 310, and an exhaust pump 320. The gas source 310 comprises an etching gas source 312, a fluorocarbon stripping gas source 314, and a reduced fluorocarbon stripping gas source 316. Within plasma processing chamber 300, the substrate 210 is positioned upon the lower electrode 308. The lower electrode 308 incorporates a suitable substrate chucking mechanism (e.g., electrostatic, mechanical clamping, or the like) for holding the substrate 210. The reactor top 328 incorporates the upper electrode 304 disposed immediately opposite the lower electrode 308. The upper electrode 304, lower electrode 308, and confinement rings 302 define the confined plasma volume 340. Gas is supplied to the confined plasma volume by gas source 310 through a gas inlet 343 and is exhausted from the confined plasma volume through the confinement rings 302 and an exhaust port by the exhaust pump 320. The exhaust pump 320 forms a gas outlet for the plasma processing chamber. A first RF source 344 is electrically connected to the upper electrode 304. A second RF source 348 is electrically connected to the lower electrode 308. Chamber walls 352 define a plasma enclosure in which the confinement rings 302, the upper electrode 304, and the lower electrode 308 are disposed. Both the first RF source 344 and the second RF source 348 may comprise a 60 MHz power source, a 27 MHz power source, and a 2 MHz power source. Different combinations of connecting RF power to the electrode are possible. A 2300® Exelan® Flex3x dielectric etch system made by Lam Research Corporation™ of Fremont, Calif. may be used in a preferred embodiment of the invention. A controller 335 is controllably connected to the first RF source 344, the second RF source 348, the exhaust pump 320, a first control valve 337 connected to the etching gas source 312, a second control valve 339 connected to the fluorocarbon stripping gas source 314, and a third control valve 341 connected to the reduced fluorocarbon stripping gas source 316. The gas inlet 343 provides gas from the gas sources 312, 314, 316 into the plasma processing enclosure. A showerhead may be connected to the gas inlet 343. The gas inlet 343 may be a single inlet for each gas source or a different inlet for each gas source or a plurality of inlets for each gas source or other possible combinations.

Figure 4A:
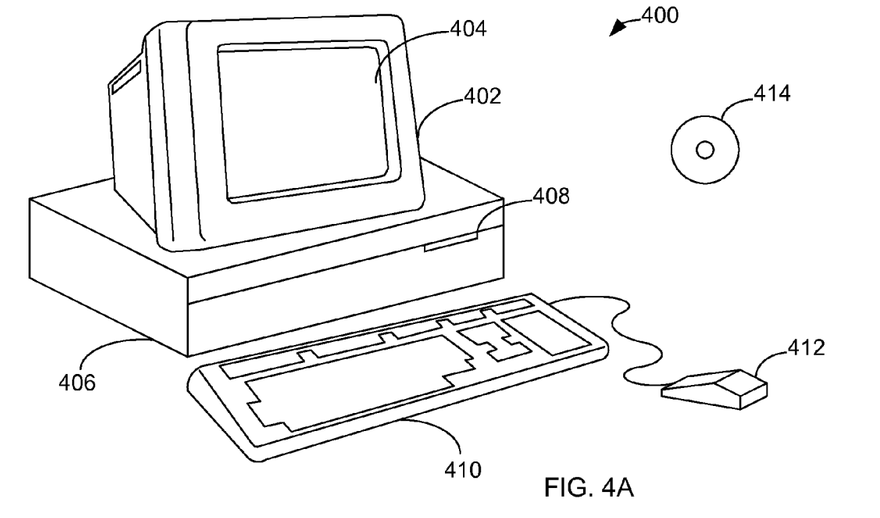
FIGS. 4A-B are schematic views of a computer system that may be used in practicing the invention.

FIGS. 4A and 4B illustrate a computer system 400, which is suitable for using as the controller 335. FIG. 4A shows one possible physical form of a computer system that may be used for the controller 335. Of course, the computer system may have many physical forms ranging from an integrated circuit, a printed circuit board, and a small handheld device up to a huge super computer. Computer system 400 includes a monitor 402, a display 404, a housing 406, a disk drive 408, a keyboard 410, and a mouse 412. Disk 414 is a computer-readable medium used to transfer data to and from computer system 400.

Figure 4B:
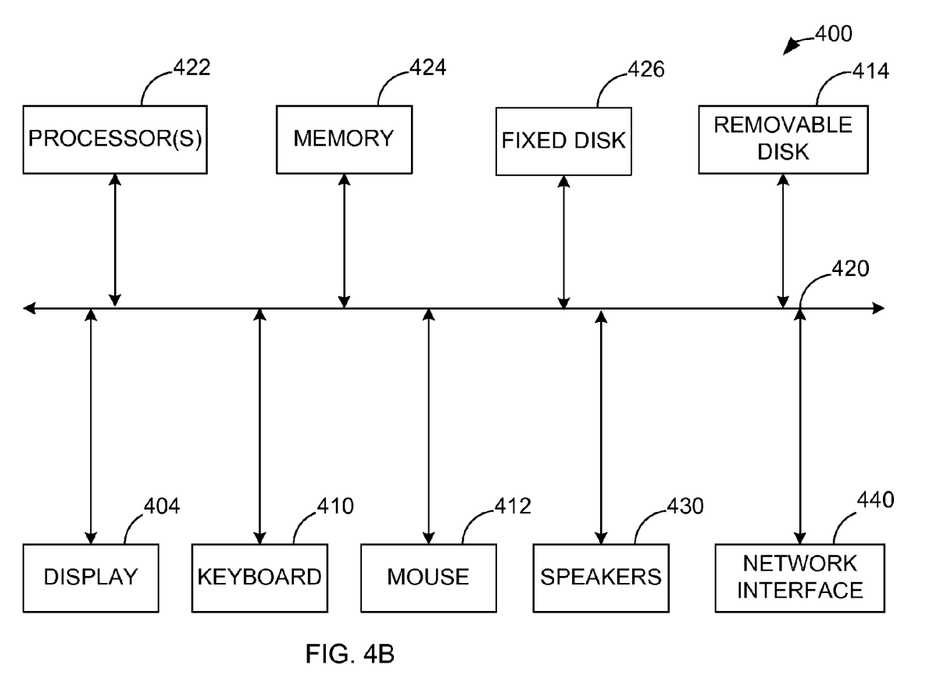

FIG. 4B is an example of a block diagram for computer system 400. Attached to system bus 420 is a wide variety of subsystems. Processor(s) 422 (also referred to as central processing units, or CPUs) are coupled to storage devices, including memory 424. Memory 424 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable type of the computer-readable media described below. A fixed disk 426 is also coupled bi-directionally to CPU 422; it provides additional data storage capacity and may also include any of the computer-readable media described below. Fixed disk 426 may be used to store programs, data, and the like and is typically a secondary storage medium (such as a hard disk) that is slower than primary storage. It will be appreciated that the information retained within fixed disk 426 may, in appropriate cases, be incorporated in standard fashion as virtual memory in memory 424. Removable disk 414 may take the form of any of the computer-readable media described below.

CPU 422 may be also coupled to a variety of input/output devices, such as display 404, keyboard 410, mouse 412, and speakers 430. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 422 optionally may be coupled to another computer or telecommunications network using network interface 440. With such a network interface, it is contemplated that the CPU might receive information from the network, or might output information to the network in the course of performing the above-described method steps. Furthermore, method embodiments of the present invention may execute solely upon CPU 422 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of tangible computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
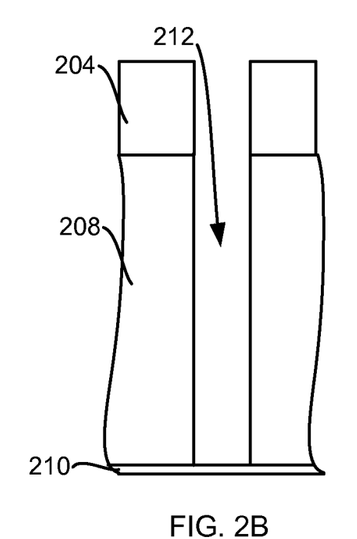

The plasma processing chamber 300 is used to etch features into the low-k dielectric layer 208 through the patterned organic mask 204 (step 108). FIG. 2B is a schematic cross-sectional view of the substrate 210, over which the low-k dielectric layer 208 is disposed, over which the patterned organic mask 204 has been formed after a feature 212 has been etched into the low-k dielectric layer 208 (step 108). A stripping of the organic mask is performed (step 110). The stripping comprises at least one cycle of a fluorocarbon stripping phase (step 112) and a reduced fluorocarbon stripping phase (step 116).

Figure 2C:
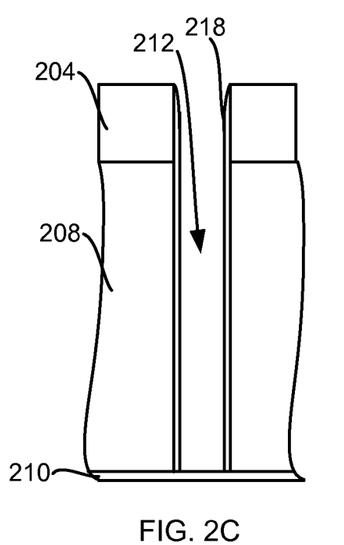
Figure 5:
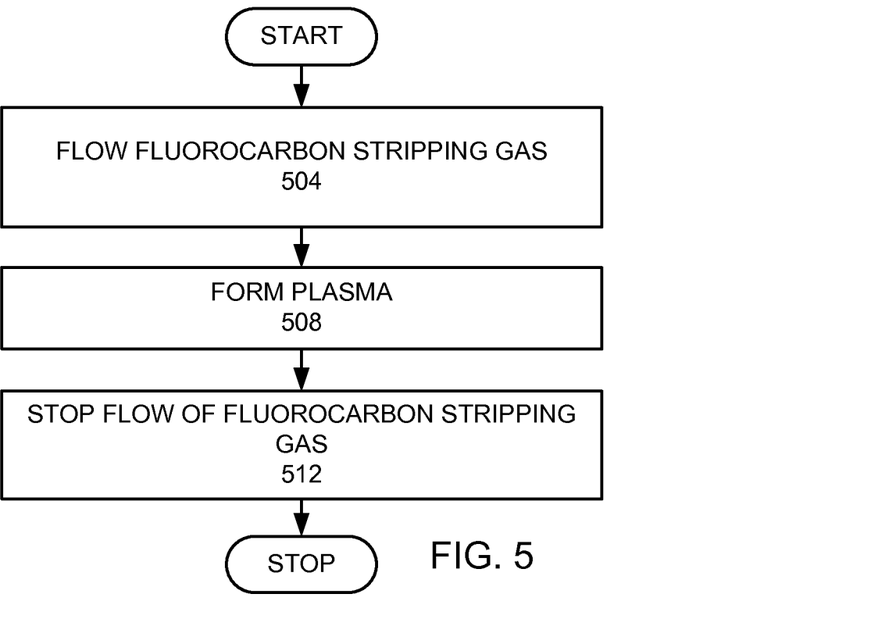
FIG. 5 is a more detailed flow chart of the fluorocarbon stripping phase.

FIG. 5 is a more detailed flow chart of the fluorocarbon stripping phase (step 112). A fluorocarbon stripping gas is flowed into the plasma processing chamber, which comprises a fluorocarbon component (step 504). The fluorocarbon stripping gas is formed into a plasma (step 508). The plasma strips the photoresist mask and forms sidewalls on the sides of the etch features. The flow of the fluorocarbon stripping gas is stopped (step 512). FIG. 2C is a schematic cross-sectional view of the substrate 210, over which the low-k dielectric layer 208 is disposed, over which the patterned organic mask 204 has been formed after a feature 212 has been etched into the low-k dielectric layer 208 (step 108) and after a first fluorocarbon stripping phase (step 110). Some of the organic mask has been stripped so that the organic mask is thinner and a sidewall 218 is formed from the fluorocarbon component.

Figure 2D:
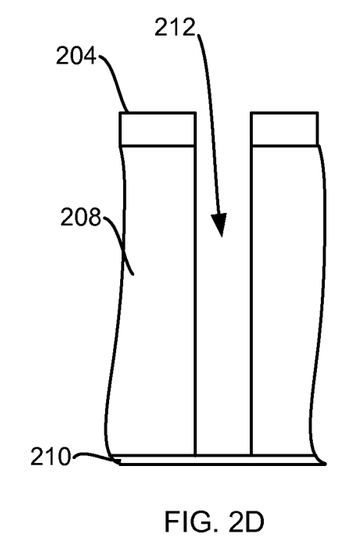
Figure 6:
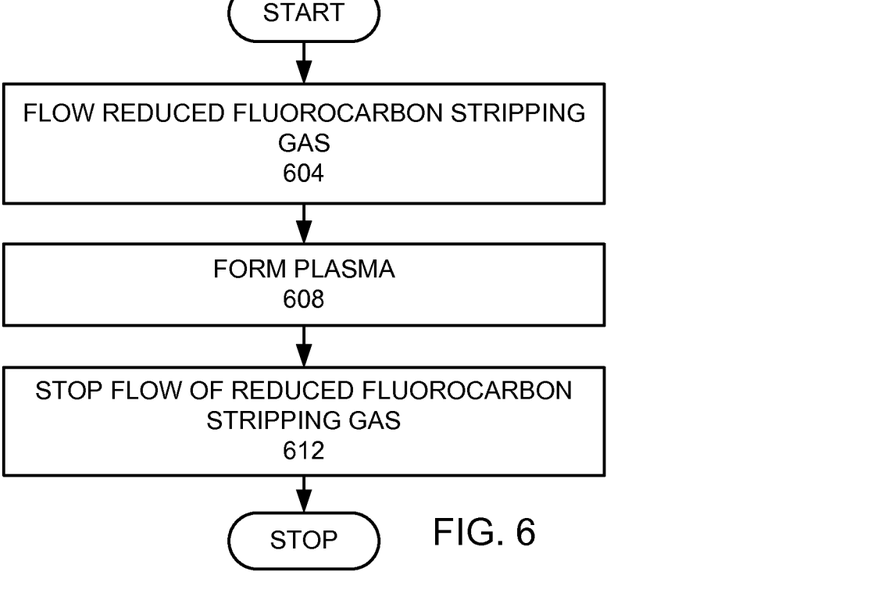
FIG. 6 is a more detailed flow chart of the reduced fluorocarbon stripping phase.

FIG. 6 is a more detailed flow chart of the reduced fluorocarbon stripping phase (step 116). A reduced fluorocarbon stripping gas is flowed into the plasma processing chamber (step 604). The reduced fluorocarbon stripping gas is formed into a plasma (step 608). The plasma strips the photoresist mask and removes at least some of the sidewalls on the sides of the etch features. The flow of the reduced fluorocarbon stripping gas is stopped (step 612). FIG. 2D is a schematic cross-sectional view of the substrate 210, over which the low-k dielectric layer 208 is disposed, over which the patterned organic mask 204 has been formed after the reduced fluorocarbon stripping phase (step 116). The organic mask has been further stripped so that the organic mask is thinner. Preferably the reduced fluorocarbon stripping phase strips faster than the fluorocarbon stripping phase, so that more of the organic mask is stripped. The reduced fluorocarbon stripping phase also strips the sidewalls, so that the sidewalls are reduced during this phase. In one embodiment, the sidewalls may be completely stripped.

In one embodiment, the organic mask is completely stripped in a single cycle. In another embodiment, a plurality of cycles is used to completely strip the organic mask.

EXAMPLES

In one example the organic mask was a patterned photoresist mask. The low-k dielectric layer was a porous ultra low-k dielectric layer of a silicon oxide based dielectric material with an organic component. The plasma processing chamber was a Lam Research Corporation 300 mm dielectric etch reactor (Flex3x).

In this example, the dielectric etch (step 108) comprised a main etch was performed by providing a main etch gas of 80 sccm $CF_4$, 160 sccm CO, and 180 sccm Ar. The pressure was set to 120 mTorr. Power was supplied at 100 watts at 2 MHz, and 1000 watts at 27 MHz, to provide a main etch for 17 seconds. The dielectric etch further comprised an over etch, which was performed by providing an over etch gas of 100 sccm CO, 6 sccm $C_4F_8$, 90 sccm $N_2$, and 200 sccm Ar. The pressure was set to 20 mTorr. Power was supplied at 500 watts at 2 MHz and 1000 watts at 27 MHz. The power at the lower frequency of 2 MHz provides a bias voltage to accelerate ions to the dielectric layer to provide etching. In this example, the etch features are low-k vias.

In this example, the strip of the organic mask (step 110) was performed by first providing the reduced fluorocarbon stripping phase (step 116). The reduced fluorocarbon stripping phase was performed by providing a reduced fluorocarbon stripping gas of 1000 sccm $CO_2$ (step 604). In this example the reduced fluorocarbon stripping gas was pure $CO_2$ and fluorine free. A pressure of 40 mTorr was provided. The reduced fluorocarbon stripping gas was formed into a plasma by providing 1200 watts at 27 MHz, which was maintained for 6 seconds (step 608). The flow of the reduced fluorocarbon stripping gas was then stopped (step 612). The reduced fluorocarbon stripping phase was followed by a fluorocarbon stripping phase (step 112) by providing a fluorocarbon stripping gas of 100 sccm CO, 6 sccm $C_4F_8$, 90 sccm $N_2$, and 200 sccm Ar (step 504). A pressure of 20 mTorr was provided. The fluorocarbon stripping gas was formed into a plasma by providing 500 watts at 27 MHz and 250 watts at 2 MHz, which was maintained for 10 seconds (step 508). The flow of the fluorocarbon stripping gas was then stopped (step 512). The presence of a higher flow rate of fluorocarbon helps provide sidewall deposition without damaging the low-k dielectric layer, while stripping the photoresist mask layer.

A second cycle of the strip of the organic mask (step 110) was performed by providing a second reduced fluorocarbon stripping phase (step 116). The second reduced fluorocarbon stripping phase was performed by providing a reduced fluorocarbon stripping gas of 1000 sccm $CO_2$. A pressure of 42.5 mTorr was provided. The second reduced fluorocarbon stripping gas was formed into a plasma by providing 1000 watts at 27 MHz, which was maintained for 6 seconds. The flow of the second reduced fluorocarbon stripping gas was then stopped. The second reduced fluorocarbon stripping phase was followed by a second fluorocarbon stripping phase (step 112) by providing a second fluorocarbon stripping gas of 100 sccm CO, 6 sccm $C_4F_8$, 90 sccm $N_2$, and 200 sccm Ar (step 504). A pressure of 20 mTorr was provided. The second fluorocarbon stripping gas was formed into a plasma by providing 250 watts at 27 MHz, which was maintained for 7 seconds (step 508). The flow of the second fluorocarbon stripping gas was then stopped (step 512).

A third cycle of the strip of the organic mask (step 110) was performed by providing a third reduced fluorocarbon stripping phase (step 116). The third reduced fluorocarbon stripping phase was performed by providing a reduced fluorocarbon stripping gas of 1000 sccm $CO_2$. A pressure of 45 mTorr was provided. The third reduced fluorocarbon stripping gas was formed into a plasma by providing 800 watts at 27 MHz, which was maintained for 6 seconds. The flow of the third reduced fluorocarbon stripping gas was then stopped. The third reduced fluorocarbon stripping phase was followed by a third fluorocarbon stripping phase (step 112) by providing a third fluorocarbon stripping gas of 100 sccm CO, 6 sccm $C_4F_8$, 90 sccm $N_2$, and 200 sccm Ar (step 504). A pressure of 20 mTorr was provided. The third fluorocarbon stripping gas was formed into a plasma by providing 125 watts at 27 MHz, which was maintained for 7 seconds (step 508). The flow of the third fluorocarbon stripping gas was then stopped (step 512).

A fourth cycle of the strip of the organic mask (step 110) was performed by providing a fourth reduced fluorocarbon stripping phase (step 116). The fourth reduced fluorocarbon stripping phase was performed by providing a reduced fluorocarbon stripping gas of 1000 sccm $CO_2$. A pressure of 47.5 mTorr was provided. The fourth reduced fluorocarbon stripping gas was formed into a plasma by providing 600 watts at 27 MHz, which was maintained for 7.5 seconds. The flow of the fourth reduced fluorocarbon stripping gas was then stopped. The fourth reduced fluorocarbon stripping phase was followed by a fourth fluorocarbon stripping phase (step 112) by providing a fourth fluorocarbon stripping gas of 100 sccm CO, 6 sccm $C_4F_8$, 90 sccm $N_2$, and 200 sccm Ar (step 504). A pressure of 20 mTorr was provided. The fourth fluorocarbon stripping gas was formed into a plasma by providing 65 watts at 27 MHz, which was maintained for 7 seconds (step 508). The flow of the fourth fluorocarbon stripping gas was then stopped (step 512).

A fifth cycle of the strip of the organic mask (step 110) was performed by providing a fifth reduced fluorocarbon stripping phase (step 116). The fifth reduced fluorocarbon stripping phase was performed by providing a reduced fluorocarbon stripping gas of 1000 sccm $CO_2$. A pressure of 50 mTorr was provided. The fifth reduced fluorocarbon stripping gas was formed into a plasma by providing 400 watts at 27 MHz, which was maintained for 10 seconds. The flow of the fifth reduced fluorocarbon stripping gas was then stopped. The fifth reduced fluorocarbon stripping phase completes the stripping process. The stripping process ends with a reduced fluorocarbon stripping phase the ensure that the sidewall deposition is removed.

In this example, the power was ramped down with successive cycles. The power ramping or other power changes or time changes for each cycle provides additional control knobs.

Figure 7:
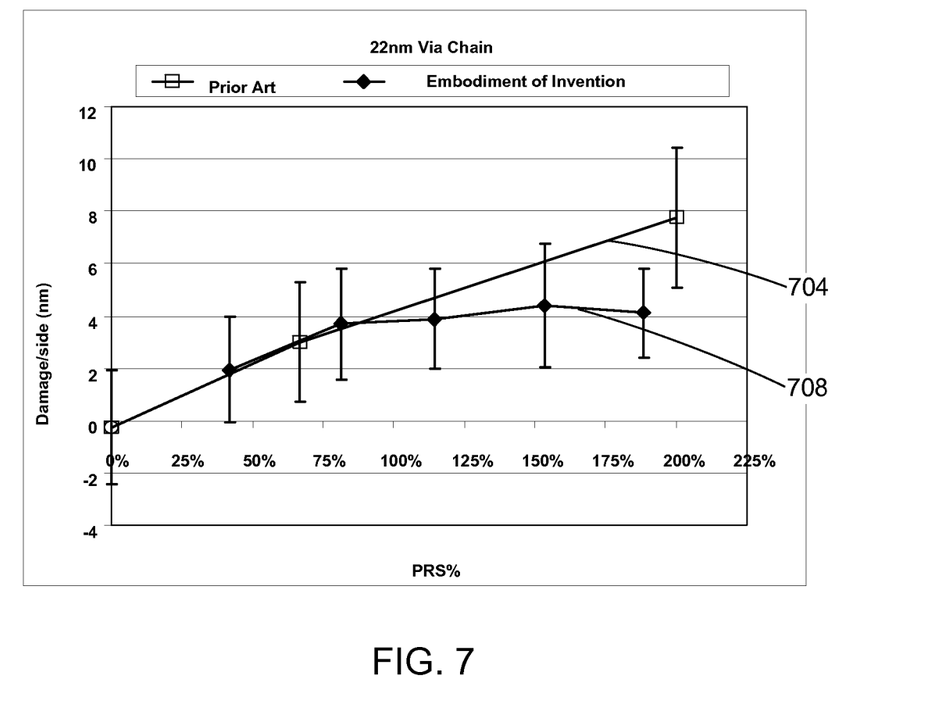
FIG. 7 is a graph that shows the ultra low-k damage in nanometers using a prior art $CO_2$ stripping process and using the inventive stripping process.

The results are also confirmed by careful inspection of the XSEM images of various samples after an HF dip. FIG. 7 is a graph that shows the ultra low-k damage in nanometers using a prior art $CO_2$ stripping process 704 and using the inventive stripping process 708. An overstrip about 100% is used so that in variable process or wafer conditions complete removal of the photoresist is ensured. As can be seen from the graph, the inventive process reduced ultra low-k dielectric damage.

Preferably the etching and stripping are performed in the same plasma processing chamber, using the same electrodes and power sources for both etching and stripping while mounted on the same chuck. In other embodiments, the substrate may be moved to another chamber so that the etching and stripping are done in separate chambers.

Preferably, the fluorocarbon has a fluorine to carbon ratio of at least 1.5:1. More preferably, the fluorocarbon is $C_4F_8$. In the specification and claims, fluorocarbons do not include hydrofluorocarbons, but instead molecules of only carbon and fluorine. Fluorocarbons in various embodiments may be $CF_4$, $C_4F_6$, and $C_5F_8$.

In an embodiment of the invention, power and/or pressure may be ramped during the stripping process. Such ramping may be used to provide less sidewall during the beginning strip cycles and more sidewall during the ending strip cycles. In another embodiment, the power and/or pressure may be feathered between cycles. A higher bias for the early cycles allows faster stripping, while lower bias for later cycles helps to reduce damage.

Although it was unexpectedly found that using a fluorocarbon during stripping reduces ultra low-k damage, it is believed that the fluorocarbon provides a fluorine containing polymer sidewall at intermittent states during the strip.

In various embodiments of the invention, the reduced fluorocarbon stripping gas may comprise at least one of $O_2$, $CO_2$, $N_2$ and $H_2$ or $NH_3$. Preferably, such reduced fluorocarbon stripping gas is fluorine free.

An embodiment of the invention is able to completely eliminate damage while maintaining a desired photoresist over strip percentage.

It was previously believed that the use of fluorocarbon during stripping would form fluorine containing polymer that would release fluorine atoms, which would damage the low-k dielectric layer. It was unexpectedly found that by applying fluorine polymer in intermittent stages in a stripping process with intervening stripping phases the low-k damage mechanism can be "turned off". Additional advantages are also provided, such as in stacks where a hard mask is placed between a photoresist mask and an ultra low-k dielectric etch layer, it has been found that the inventive stripping process reduces hard mask top necking. The reduction of hard mask necking reduces bowing in the post-strip profile.

Preferably the fluorocarbon gas flow ranges from 2-100 sccm during the fluorocarbon stripping phase. Other additive gases and diluents such as 0-200 sccm of CO, 0-200 sccm of N2, 0-300 sccm of Ar etc. may also be used in various embodiments. Preferably the pressure range is 10-200 mTorr. Preferably the RF power range is 50-5000 W. More preferably the RF power range is 50-2000 W.

Other embodiments of the invention may use microwave or downstream RF strip processes.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for forming etched features in a low-k dielectric layer disposed below a photoresist mask in a plasma processing chamber, comprising:
    etching features into the low-k dielectric layer through the photoresist mask; and
    stripping the photoresist mask after the features are etched into the low-k dielectric layer, wherein the stripping the photoresist mask comprises a plurality of cycles, wherein each cycle comprises:
    a fluorocarbon stripping phase, comprising:
        flowing a fluorocarbon stripping gas into the plasma processing chamber, wherein the fluorocarbon stripping gas comprises fluorocarbon;
        forming sidewalls during the fluorocarbon stripping phase;
        forming a plasma from the fluorocarbon stripping gas;
        forming sidewalls using the plasma;
        stripping at least some of the photoresist mask using the plasma; and
        stopping the flow of the fluorocarbon stripping gas into the plasma processing chamber; and
    a reduced fluorocarbon stripping phase, comprising:
        flowing a reduced fluorocarbon stripping gas that has a lower fluorocarbon flow rate than the fluorocarbon stripping gas into the plasma processing chamber, wherein the fluorocarbon of the fluorocarbon stripping gas is at least one of $C_4F_6$ and $C_4F_8$;
        forming the plasma from the reduced fluorocarbon stripping gas;
        removing at least some of the sidewalls using the plasma;
        stripping at least some of the photoresist mask using the plasma; and
        stopping the flow of the reduced fluorocarbon stripping gas.

2. The method, as recited in claim 1, wherein the low-k dielectric is a silicon oxide based dielectric with an organic component.

3. The method, as recited in claim 2, wherein the fluorocarbon stripping phase forms sidewalls and simultaneously strips the photoresist mask.

4. The method, as recited in claim 3, wherein the reduced fluorocarbon stripping phase removes sidewall and simultaneously strips photoresist mask.

5. The method, as recited in claim 4, wherein the etching and stripping are performed in a single plasma processing chamber.

6. The method, as recited in claim 5, wherein the reduced fluorocarbon stripping gas is fluorine free.

7. The method, as recited in claim 6, wherein the fluorocarbon in the fluorocarbon stripping gas has a fluorine to carbon ratio of at least 1.5:1.

8. The method, as recited in claim 1, wherein the fluorocarbon stripping gas further comprises CO.

9. The method, as recited in claim 8, wherein the reduced fluorocarbon stripping gas comprises at least one of $O_2$, $CO_2$, $N_2$ and $H_2$ or $NH_3$.

10. The method, as recited in claim 1, wherein the fluorocarbon stripping phase forms sidewalls and strips the photoresist mask.

11. The method, as recited in claim 1, wherein the reduced fluorocarbon stripping gas is fluorine free.

12. The method, as recited in claim 1, wherein the fluorocarbon in the fluorocarbon stripping gas is $C_4F_8$.

13. The method, as recited in claim 1, wherein the fluorocarbon in the fluorocarbon stripping gas has a fluorine to carbon ratio of at least 1.5:1.

14. The method, as recited in claim 1, wherein the low-k dielectric layer is a porous low-k dielectric layer.

15. The method, as recited in claim 1, wherein the fluorocarbon flow rate of the reduced fluorocarbon stripping gas is greater than zero.

16. A method for stripping an organic mask layer from over an etched low-k dielectric layer in a processing chamber, comprising:
    stripping the organic mask from the etched low-k dielectric layer comprising a plurality of cycles cycle, wherein each cycle comprises:
    a fluorocarbon stripping phase, comprising:
        flowing a fluorocarbon stripping gas into the processing chamber, wherein the fluorocarbon stripping gas comprises fluorocarbon;
        forming sidewalls during the fluorocarbon stripping phase;
        forming a plasma from the fluorocarbon stripping gas;
        forming sidewalls using the plasma;
        stripping at least some of the photoresist mask using the plasma; and
        stopping the flow of the fluorocarbon stripping gas into the processing chamber; and
    a reduced fluorocarbon stripping phase, comprising:
        flowing a reduced fluorocarbon stripping gas that has a lower fluorocarbon flow rate than the fluorocarbon stripping gas into the processing chamber, wherein the fluorocarbon of the fluorocarbon stripping gas is at least one of $C_4F_6$ and $C_4F_8$;
        forming the plasma from the reduced fluorocarbon stripping gas;
        removing at least some of the sidewalls using the plasma;
        stripping at least some of the photoresist mask using the plasma; and
        stopping the flow of the reduced fluorocarbon stripping gas.

* * * * *